United States Patent [19]

Kato

[11] Patent Number: 5,805,028

[45] Date of Patent: Sep. 8, 1998

[54] TEMPERATURE-COMPENSATING PIEZO-OSCILLATOR

[75] Inventor: Akira Kato, Osaka, Japan

[73] Assignee: Murata Manufacturing Co., Ltd., Kyoto, Japan

[21] Appl. No.: 789,424

[22] Filed: Jan. 29, 1997

[30] Foreign Application Priority Data

Feb. 19, 1996 [JP] Japan .................................. 8-030903

[51] Int. Cl.$^6$ ...................................................... H03B 5/30
[52] U.S. Cl. ...................................... 331/116 R; 331/176
[58] Field of Search ........................ 331/116 R, 116 FE, 331/176, 66

[56] References Cited

U.S. PATENT DOCUMENTS

| | | | |
|---|---|---|---|
| 4,851,792 | 7/1989 | Ochiai et al. | 331/176 |
| 5,004,988 | 4/1991 | Ueno et al. | 331/116 R |
| 5,473,289 | 12/1995 | Kshizaki et al. | 331/176 |

*Primary Examiner*—David C. Nelms
*Assistant Examiner*—Hoai Ho

*Attorney, Agent, or Firm*—Majestic, Parsons, Siebert & Hsue P.C.

[57] ABSTRACT

A temperature-compensating piezo-oscillator uses a piezo-oscillator with temperature coefficient of frequency changing approximately linearly and includes a stabilized source circuit, a temperature-compensating circuit, a voltage control oscillator circuit and a buffer-amplifier circuit. The stabilized source circuit is for stabilizing an inputted voltage and outputs a stabilized voltage. The temperature-compensating circuit is for receiving this stabilized voltage and outputs a temperature-compensated voltage corresponding to the ambient temperature. The voltage control oscillator circuit is for receiving this temperature-compensated voltage and causes the resonance frequency of the piezo-oscillator to change according to this received temperature-compensated voltage, outputting a high-frequency signal. The buffer-amplifier circuit receives and amplifies this high-frequency signal and outputs a high-frequency output voltage. The temperature-compensating circuit includes a thermistor having a negative temperature characteristic, a resistor which is connected in series with one end of this thermistor, another resistor connected in parallel with this series connection, and at least two other resistors each connected to the other end of the thermistor.

3 Claims, 2 Drawing Sheets

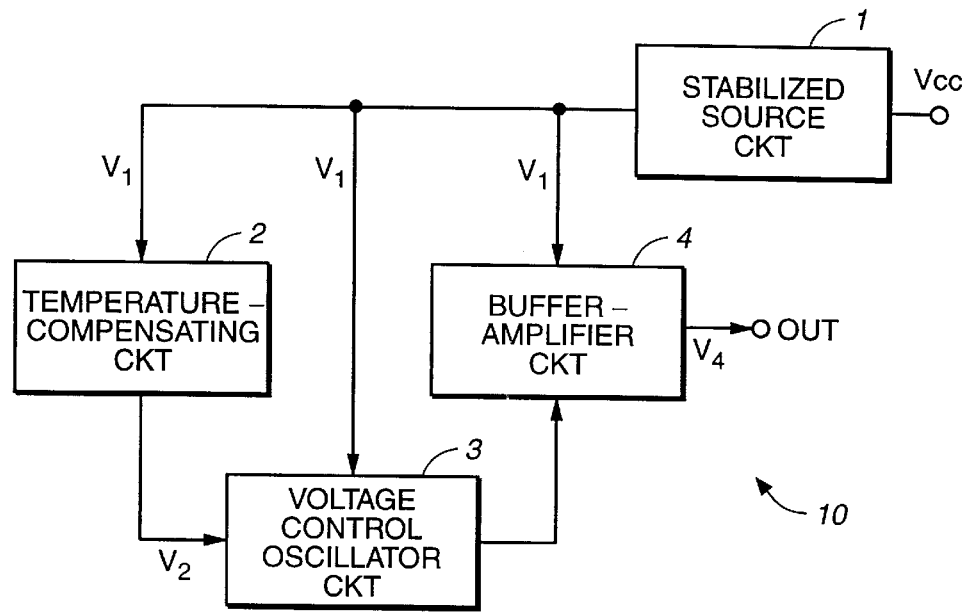
FIG._1
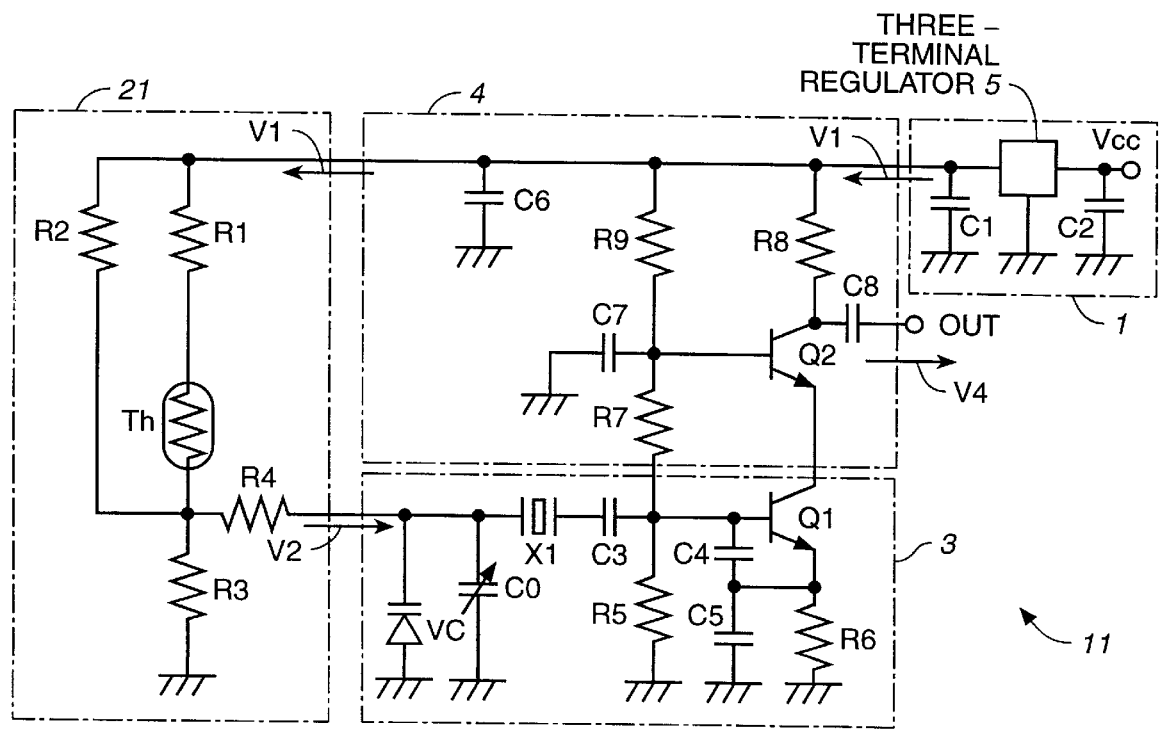
FIG._2

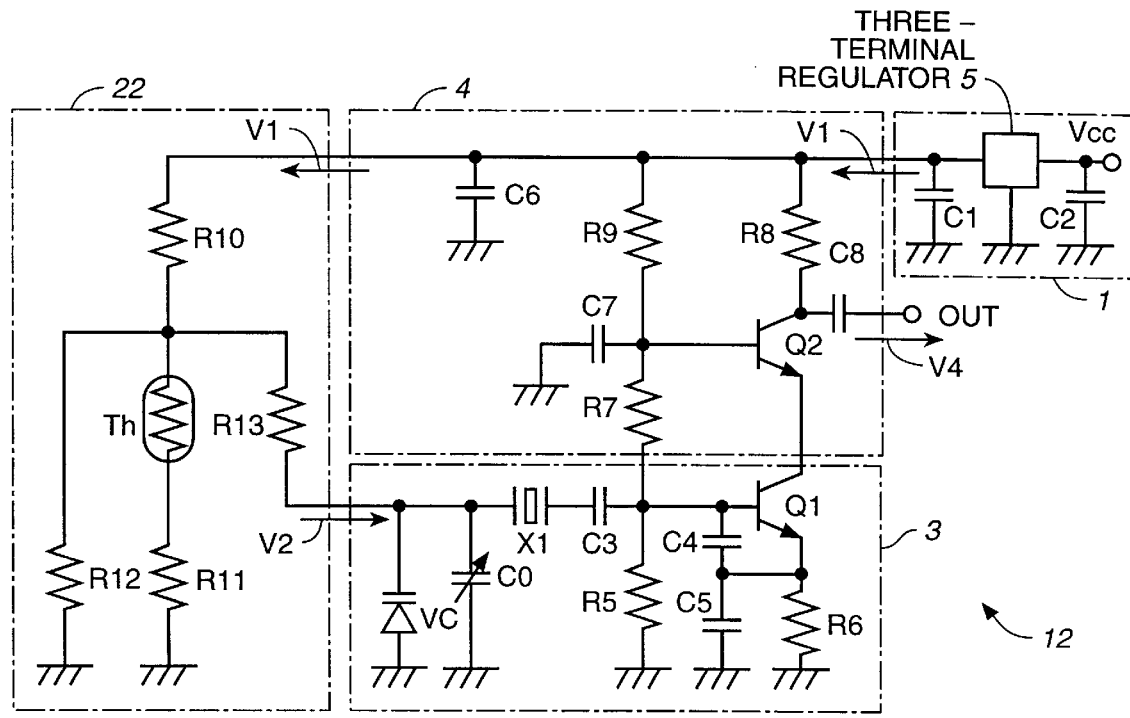
FIG._3
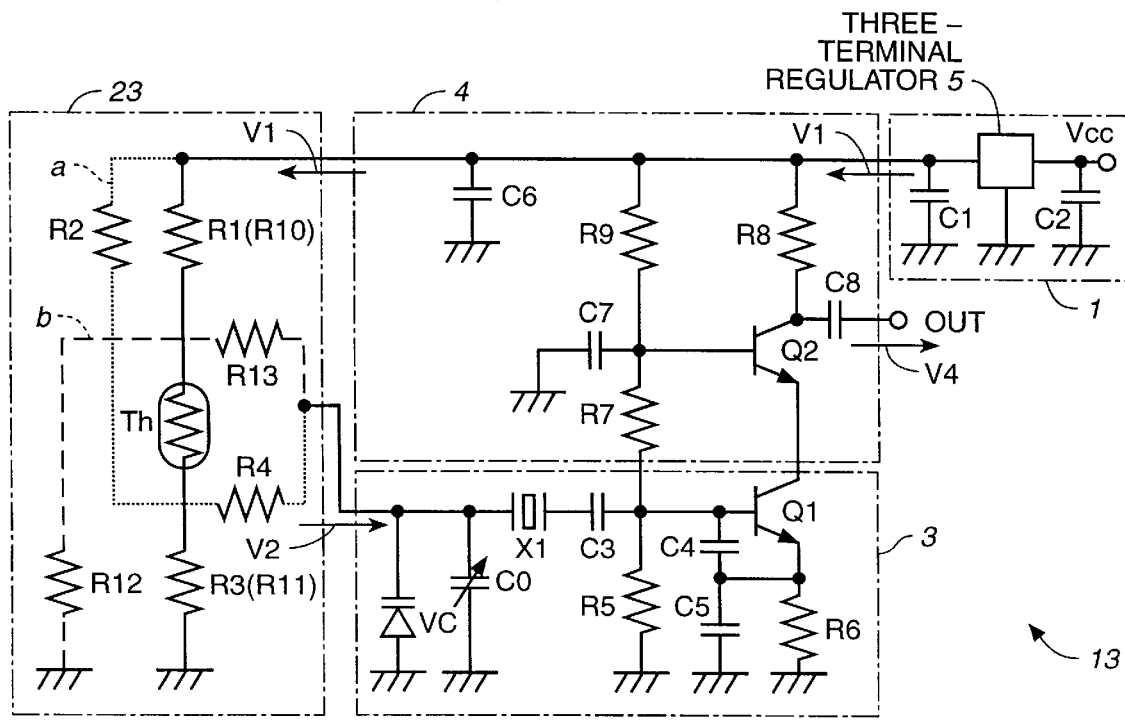
FIG._4

TEMPERATURE-COMPENSATING PIEZO-OSCILLATOR

BACKGROUND OF THE INVENTION

This invention relates to a temperature-compensating piezo-oscillator and more particularly to a temperature-compensating piezo-oscillator usable in a terminal of a portable cellular radio device.

Piezo-oscillators using a GT cut quartz oscillator have been known. It has also been known to use in such a piezo-oscillator a quarts oscillator of which the resonance frequency changes according to the ambient temperature, that is, a quartz oscillator having a temperature coefficient for its frequency (TCF). When a piezo-oscillator is used in a terminal of a portable cellular radio device, its TCF is required to be stable within the range of ±1.0 ppm to ±2.5 ppm with the temperature within the range of −20° C. to +60° C.

A prior art method of obtaining quartz oscillators satisfying this requirement was to produce a large number of GT cut quartz oscillators and to select from them those having required stability against temperature changes, but this method is not efficient because it takes both labor and time to carry out this selection process, affecting the production cost adversely.

In view of the above, Japanese Patent Publication Tokkai 7-99411 disclosed a quartz oscillator circuit which uses a temperature-compensating capacitor to compensate the TCF of its quarts oscillator by means of a circuit. The circuits according to this publication, however, are adapted to carry out compensation for a GT cut quartz crystal oscillator having either a positive or negative TCF. In order to use such a quartz oscillator, therefore, it is necessary to prepare different circuit boards for the two situations, to first determine whether the TCF of the given quartz oscillator is positive of negative, and then to mount the appropriate one of the prepared circuit boards. Neither is this an efficient method because two kinds of circuit board must be prepared and this, too, affects the production cost and the productivity adversely. Moreover, temperature-compensating capacitors having a positive temperature coefficient for electrostatic capacitance are expensive and there are not many kinds of them available to be practical.

SUMMARY OF THE INVENTION

It is therefore an object of the invention to eliminate these problems of prior art temperature-compensation piezo-oscillators by providing an improved temperature-compensating piezo-oscillator capable of easily and inexpensively providing signals of oscillation frequency that are stable against changes in ambient temperature.

It is another object of this invention to provide such temperature-compensating piezo-oscillators that are compact.

A temperature-compensating piezo-oscillator embodying this invention, with which the above and other objects can be accomplished, may be characterized as including a piezo-oscillator with temperature coefficient of frequency changing approximately linearly and comprising a stabilized source circuit, a temperature-compensating circuit, a voltage control oscillator circuit and a buffer-amplifier circuit. The stabilized source circuit is for stabilizing a supply voltage. The temperature-compensating circuit is for receiving this stabilized voltage and outputs a temperature-compensated voltage corresponding to the ambient temperature. The frequency of the voltage control oscillator circuit is controlled by this temperature-compensated voltage and causes the resonance frequency of the piezo-oscillator to change according to this temperature-compensated voltage, outputting a high-frequency signal. The buffer-amplifier circuit then receives and amplifies this high-frequency signal and thereby outputs a high-frequency output voltage. The temperature-compensating circuit is further characterized as comprising a thermistor having a negative temperature coefficient, a resistor which is connected in series with one end of this thermistor, another resistor connected in parallel with this series connection, and at least two other resistors each connected to the other end of the thermistor. These components of the temperature-compensating circuit are arranged differently, depending on whether the frequency of the piezo-oscillator has a negative or positive temperature coefficient. Alternatively, circuits for both situations corresponding to piezo-oscillators with positive and negative temperature coefficients for the frequency may be formed on a single circuit board such that one of the circuits can be selectively used, depending on the situation.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a block diagram of a temperature-compensating piezo-oscillator embodying this invention;

FIG. 2 is a circuit diagram of a temperature-compensating piezo-oscillator according to a first embodiment of this invention;

FIG. 3 is a circuit diagram of another temperature-compensating piezo-oscillator according to a second embodiment of this invention; and FIG. 4 is a circuit diagram of still another temperature-compensating piezo-oscillator according to a third embodiment of this invention.

Throughout herein, components that are substantially the same, although parts of different circuits, are indicated by the same symbols and may not be repetitively explained or described.

DETAILED DESCRIPTION OF THE INVENTION

FIG. 1 shows the general structure of a temperature-compensating piezo-oscillator 10 embodying this invention, characterized as comprising a stabilized source circuit 1, a temperature-compensating circuit 2 for receiving voltage V1 outputted from the stabilized source circuit 1, a voltage control oscillator circuit 3 for receiving voltage V2 outputted from the temperature-compensating circuit 2 and a buffer-amplifier circuit 4 for receiving both the voltage V1 from the stabilized source circuit 1 and an output signal from the voltage control oscillator circuit 3.

FIG. 2 shows a temperature-compensating piezo-oscillator 11 according to a first embodiment of this invention with the general structure shown in FIG. 1. Its stabilized source circuit 1 comprises capacitors C1 and C2 and a three-terminal voltage regulator 5 for stabilizing received voltage VCC and thereby outputting a stabilized voltage V1. The temperature-compensating circuit 21 comprises a first resistor R1, a thermistor Th having a negative temperature coefficient (referred to as the NTC thermistor) connected in series with the first resistor R1, a second resistor R2 connected in parallel with the aforementioned series connection consisting of the first resistor R1 and the NTC thermistor Th, a third resistor R3 and a fourth resistor R4 connected such that the stabilized voltage V1 applied at one end of the aforementioned parallel connection between the series connection and the second resistor R2 is divided between this parallel connection and the third resistor R3 and that the divided voltage can be outputted through the fourth resistor R4 as output voltage V2 of the temperature-compensating circuit 21.

The voltage control oscillator circuit 3 comprises a varactor diode VC, a variable capacitor CO for fine adjustment of frequency, a GT cut quarts crystal oscillator X1 serving as a quartz oscillator with the temperature coefficient changing approximately linearly, a direct-current cut capacitor C3, capacitors C4 and C5 for dividing high-frequency signals, resistors R5 and R6, and a transistor Q1 such that changes in the voltage V2 received from the temperature-compensating circuit 21 will cause the capacitance of the varactor diode VC to change, thereby causing the resonant frequency of the resonator circuit including the GT cut quartz crystal oscillator X1 and thereby outputting a frequency signal from the collector of the transistor Q1 by causing the oscillator frequency of the voltage control oscillator circuit 3

The buffer amplifier circuit 4 comprises capacitors C6, C7 and C8, resistors R7, R8 and R9 and a transistor Q2 such that the high-frequency signal outputted from the voltage control oscillator circuit 3 is received through the emitter of the transistor Q2, that the voltage V1 from the stabilized source circuit 1 is supplied as the source voltage for the collector of the transistor Q2 and that the transistor Q2 will function as a grounded base amplifier. Capacitor C7 functions as a bypass for high-frequency signals through the base of the transistor Q2. The common base amplifier formed by the transistor Q2 serves to suppress the changes in frequency against load variations and to output from an output terminal OUT through the direct-current cut capacitor C8 a high-frequency output voltage V4 from the buffer amplifier circuit 4 as the output voltage from the temperature-compensating piezo-oscillator 11. In the temperature-compensating piezo-oscillator 11 shown in FIG. 2, the temperature-compensating circuit 21 has a circuit structure corresponding to the situation where the GT cut quartz crystal oscillator X1 has a negative TCF.

FIG. 3 shows another temperature-compensating piezo-oscillator 12 corresponding to a situation where the GT cut crystal oscillator X1 has a positive TCF. In FIG. 3, the stabilized source circuit 1, voltage control oscillator circuit 3 and buffer amplifier circuit 4 are each of the circuit structure as shown in FIG. 2 and hence they will be indicated by the same numerals and will not be explained repetitively.

The temperature-compensating circuit 22 for this temperature-compensating piezo-oscillator 12 comprises resistor R10, resistors R12 and R13 individually connected in series with resistor R10 and a series connection consisting of an NTC thermistor Th and resistor R11 also connected in series with resistor R10. When voltage V1 outputted from the stabilized source circuit 1 is received by this temperature-compensating circuit 22, it is divided between resistor R10 and resistors R11 and R12 and NTC thermistor Th which are connected in series therewith and a divided voltage is drawn through resistor R13 as the output voltage V2 from this temperature-compensating circuit 22.

As explained above, the temperature-compensating piezo-oscillators 11 and 12 shown in FIGS. 2 and 3 correspond respectively to situations where the TCF of the GT cut quartz crystal oscillator X1 is positive and negative. Since the only difference between these two piezo-oscillators 11 and 12 is in the circuit structure of their temperature-compensating circuits 21 and 22, still another temperature-compensating piezo-oscillators 13 may be formed with still another temperature-compensating circuit 23 as shown in FIG. 4, wherein resistors R1 and R3 respectively also serve the functions of resistors R10 and R11, the circuit pattern "a" (including resistors R2 and R4 and shown by dotted line) corresponding to the situation of FIG. 2 where the TCF of the GT cut quartz crystal oscillator X1 is negative and the circuit pattern "b" (including resistors R12 and R13 and shown by broken line) corresponding to the situation of FIG. 3 where the TCF of the GT cut quartz crystal oscillator X1 is positive. When the TCF of the GT cut quartz crystal oscillator X1 is negative, for example, the circuit pattern "b", which is not necessary, has only to be removed, say, by cutting it off by a laser beam or by not mounting resistors R11 and R12 on a circuit board (not shown).

The examples shown above are not intended to limit the scope of the invention. Although GT cut quartz crystal oscillators are disclosed, they may be substituted by an piezo-oscillator of another kind as long as its TCF changes approximately linearly. Similarly, resistors and NTC thermistors of various types may be used, such as those in the form of chips or those formed on a circuit board by printing and burning a resistor paste or by a vapor deposition process or a sputtering process. In summary, a temperature-compensating piezo-oscillator embodying this invention is characterized as making use of a temperature-compensating circuit comprising only one NTC thermistor and a small number of resistors such that the total number of components, and hence also the production cost can also be reduced. The area occupied thereby on a circuit board can also be reduced, and this makes it possible to provide more compact devices. The invention further contributes to the reduction in cost because it makes it unnecessary to prepare two kinds of circuit boards corresponding to the negative and positive TCF.

What is claimed is:

1. A temperature-compensating piezo-oscillator including a piezo-oscillator with temperature coefficient of frequency which is approximately either a positive or negative constant, said temperature-compensating piezo-oscillator comprising:

a stabilized source circuit for stabilizing an inputted voltage to output a stabilized voltage;

a temperature-compensating circuit for receiving said stabilized voltage and thereby outputting a temperature-compensated voltage corresponding to an ambient temperature;

a voltage control oscillator circuit for receiving said temperature-compensated voltage, causing the resonance frequency of said piezo-oscillator to change according to said received temperature-compensated voltage, and thereby outputting a high-frequency signal; and a buffer-amplifier circuit for receiving and amplifying said high-frequency signal and thereby outputting a high-frequency output voltage;

said temperature-compensating circuit including a first circuit and a second circuit both on a single circuit board, said first circuit corresponding to a first situation wherein said temperature coefficient of said piezo-oscillator is negative and said second circuit corresponding to a second situation wherein said temperature coefficient of said piezo-oscillator is positive, said temperature-compensating circuit comprising an NTC thermistor, which is a thermistor having a negative temperature coefficient, a first resistor which is connected in series with one end of said NTC thermistor to together form a series connection, a second resistor connected in parallel with said series connection, a third resistor with one end grounded, a fourth resistor connected to said voltage control oscillator circuit, a fifth resistor with one end connected to a junction between said first resistor and said NTC thermistor and the other end connected to said voltage control oscillator circuit, and a sixth resistor with one end connected between said first resistor and said NTC thermistor, the other end of said sixth resistor being grounded.

2. The temperature-compensating piezo-oscillator of claim 1 wherein said stabilized voltage outputted from said stabilized source circuit is received by said temperature-compensating circuit through said third resistor.

3. The temperature-compensating piezo-oscillator of claim 1 wherein said stabilized voltage outputted from said stabilized source circuit is received by said temperature-compensating circuit through one end of said first resistor distal from said NTC thermistor.

* * * * *